United States Patent [19]
Manning

[11] Patent Number: 6,032,274
[45] Date of Patent: *Feb. 29, 2000

[54] METHOD AND APPARATUS FOR COMPRESSED DATA TESTING OF MORE THAN ONE MEMORY ARRAY

[75] Inventor: Troy A. Manning, Meridian, Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/879,409

[22] Filed: Jun. 20, 1997

[51] Int. Cl.$^7$ .................................................... G06F 11/00
[52] U.S. Cl. ............................................................ 714/718
[58] Field of Search ................................. 371/21.1, 21.2, 371/21.4, 21.6; 365/201; 395/182.03

[56] References Cited

U.S. PATENT DOCUMENTS

| | | | |
|---|---|---|---|
| 5,029,330 | 7/1991 | Kajigaya | 365/201 |
| 5,268,639 | 12/1993 | Gasbarro et al. | 324/158 R |
| 5,289,415 | 2/1994 | DiMarco et al. | 365/190 |
| 5,305,272 | 4/1994 | Matsuo et al. | 365/208 |
| 5,451,898 | 9/1995 | Johnson | 327/563 |
| 5,488,321 | 1/1996 | Johnson | 327/66 |
| 5,519,661 | 5/1996 | Miura | 365/205 |
| 5,621,340 | 4/1997 | Lee et al. | 327/65 |
| 5,684,750 | 11/1997 | Kondoh et al. | 365/205 |
| 5,708,607 | 1/1998 | Lee et al. | 365/189.05 |
| 5,809,038 | 9/1998 | Martin | 371/21.2 |

FOREIGN PATENT DOCUMENTS

| | | | |
|---|---|---|---|
| 0 283 906 A1 | 9/1988 | European Pat. Off. | G11C 29/00 |
| 0 828 252 A2 | 3/1998 | European Pat. Off. | G11C 7/06 |
| 0 840 328 A2 | 5/1998 | European Pat. Off. | G11C 29/00 |

OTHER PUBLICATIONS

Ishibashi, K. et al, "A 6–ns 4–Mb CMOS SRAM with Offset–Voltage–Insensitive Current Sense Amplifiers," IEEE Journal of Solid–State Circuits, vol. 30, No. 4, Apr. 1995, pp. 728–733.

Kuroda, T. et al., "Automated Bias Control (ABC) Circuit for High–Performance VLSI's," IEEE Journal of Solid–State Circuits, vol. 27, No. 4, Apr. 1992, pp. 539–545.

Descriptive literature entitled, "400 MHz SLDRAM, 4M×16 SLDRAM Pipelined, Eight Bank, 2.5 V Operation," pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1–56.

Taguchi, M. et al., "A 40–ns 64–Mb DRAM with 64–b Parallel Data Bus Architecture," IEEE Journal of Solid–State Circuits, vol. 26, No. 11, Nov. 1991, pp. 1493–1497.

Taguchi M. et al., A 40ns 64Mb DRAM with Current–Sensing Data–Bus Amplifier, ISSCC Digest of Technical Papers, 1991, TAM 6.5.

Takeshi, N. et al., "A 17–ns 4–Mb CMOS DRAM," IEEE Journal of Solid State Circuits, vol. 26, No. 11, Nov. 1991, pp. 1538–1543.

*Primary Examiner*—Vincent P. Canney
*Attorney, Agent, or Firm*—Dorsey & Whitney LLP

[57] ABSTRACT

A memory device includes an output data path that transfers data from an I/O circuit coupled to a memory array to an output tri-state buffer. A comparing circuit compares data from the I/O circuit to a desired data pattern. If the data does not match the desired pattern, the comparing circuit outputs an error signal that is input to the output buffer. When the output buffer receives the error signal, the output buffer is disabled and outputs a tri-state condition on a data bus. Since the error signal corresponds to more than one data bit, the tri-state condition of the output buffer is held for more than one tick of the data clock, rather than only a single tick. Consequently, the tri-state condition remains on the bus for sufficiently long that a test system can detect the tri-state condition even at very high clock frequencies.

40 Claims, 6 Drawing Sheets

METHOD AND APPARATUS FOR COMPRESSED DATA TESTING OF MORE THAN ONE MEMORY ARRAY

TECHNICAL FIELD

The present invention relates to integrated memory devices and more particularly to data transfer in memory devices.

BACKGROUND OF THE INVENTION

Conventional computer systems include a processor coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of the computer system, with the exception of SRAM cache memory, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, and the input devices, output devices, and data storage devices are coupled to the processor bus through a bus bridge. The memory controller allows the system memory devices to operate at a clock frequency that is substantially lower than the clock frequency of the processor. Similarly, the bus bridge allows the input devices, output devices, and data storage devices to operate at frequency that is a substantially lower than the clock frequency of the processor. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs, which did not require that an address be provided to the DRAM for each memory access. More recently, synchronous dynamic random access memories ("SDRAMs") have been developed to allow the pipelined transfer of data at the clock speed of the motherboard. However, even SDRAMs are typically incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory may be coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

Figure 1:
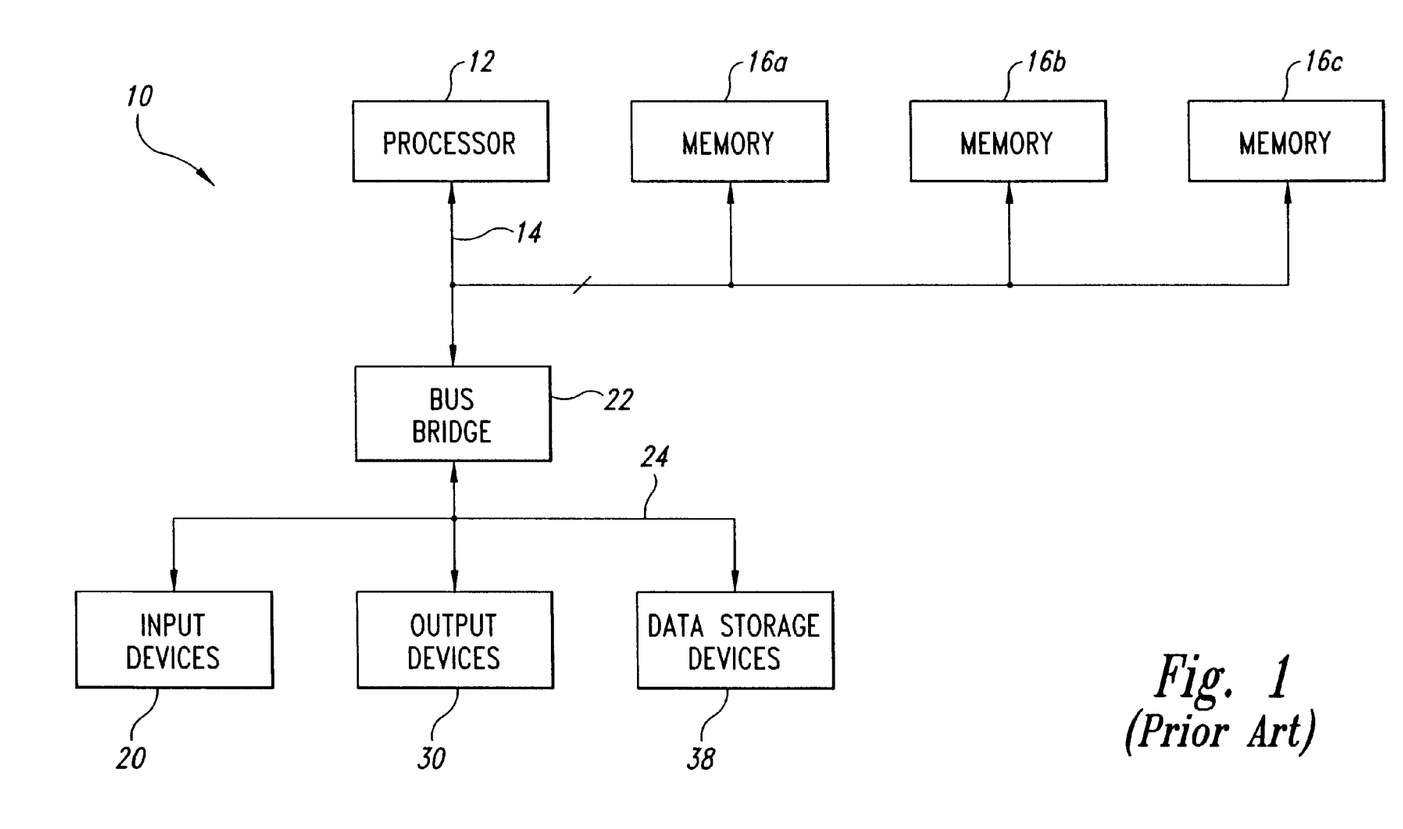
FIG. 1 is a block diagram of a computer system using SyncLink architecture.

An example of a computer system 10 using the SyncLink architecture is shown in FIG. 1. The computer system 10 includes a processor 12 having a processor bus 14 coupled to three packetized dynamic random access memory or SyncLink DRAMs ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c and the bus bridge 22 having a unique identifier, and the command packet contains an identifying code that selects only one of these components.

The computer system 10 also includes a number of other components and signal lines which have been omitted from FIG. 1 in the interests of brevity. For example, as explained below, the memory devices 16a–c also receive a master clock signal CKEXT to provide internal timing signals, a data clock signal DCLK clocking data into or out of the memory device 16, and a FLAG signal signifying the start of a command packet.

Figure 2:
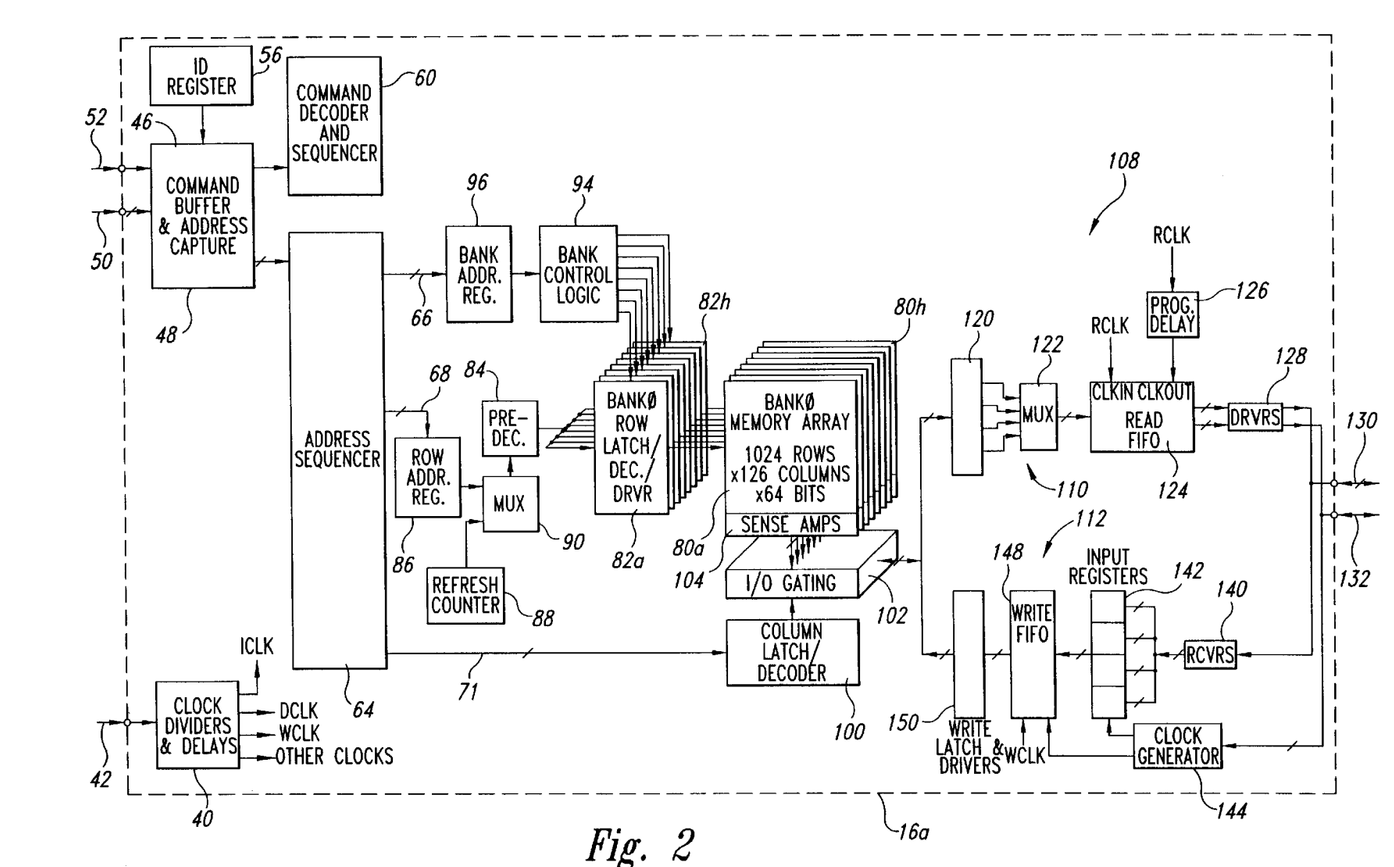
FIG. 2 is a block diagram of a packetized DRAM used in the computer system of FIG. 1.

One of the memory devices 16a is shown in block diagram form in FIG. 2. The memory device 16a includes a clock divider and delay circuit 40 that receives a master clock signal CKEXT and generates an internal clock signal CKINT and a large number of other clock and timing signals to control the timing of various operations in the memory device 16. The memory device 16 also includes a command buffer 46 and an address capture circuit 48 which receive an internal clock signal CKINT, a command packet CA0–CA9 on a 10-bit command bus 50, and a FLAG signal on line 52. As explained above, the command packet contains control and address information for each memory transfer, and the FLAG signal identifies the start of a command packet which may include more than one 10-bit packet word. In fact, a command packet is generally in the form of a sequence of 10-bit packet words on the 10-bit command bus 50. Each of the 10-bit packet words is received on a respective clock edge (rising or falling) of the master clock CKEXT. Thus, a 40-bit packet is typically received at four clock edges, i.e., over two cycles of the master clock CKEXT.

The command buffer 46 receives the command packet from the bus 50, and compares at least a portion of the command packet to identifying data from an ID register 56 to determine if the command packet is directed to the memory device 16a or some other memory device 16b, c. If the command buffer 46 determines that the command packet is directed to the memory device 16a, it then provides a command word to a command decoder and sequencer 60. The command decoder and sequencer 60 generates a large number of internal control signals to control the operation of the memory device 16a during a memory transfer.

The address capture circuit 48 also receives the command words from the command bus 50 and outputs a 20-bit address corresponding to the address information in the command packet. The address is provided to an address sequencer 64 which generates a corresponding 3-bit bank address on bus 66, a 10-bit row address on bus 68, and a 7-bit column address on bus 71. The column address and row address are processed by column and row address paths 73, 75 as will be described below.

One of the problems of conventional DRAMs is their relatively low speed resulting from the time required to precharge and equilibrate circuitry in the DRAM array. The packetized DRAM 16a shown in FIG. 2 largely avoids this problem by using a plurality of memory banks 80, in this case eight memory banks 80a–h. After a memory read from one bank 80a, the bank 80a can be precharged while the remaining banks 80b–h are being accessed.

Each of the memory banks 80a–h receives a row address from a respective row latch/decoder/driver 82a–h. All of the row latch/decoder/drivers 82a–h receive the same row address from a predecoder 84 which, in turn, receives a row address from either a row address register 86, redundant row circuit 87, or a refresh counter 88 as determined by a multiplexer 90. However, only one of the row latch/decoder/drivers 82a–h is active at any one time as determined by bank control logic 94 as a function of a bank address from a bank address register 96.

Each of the memory banks 80a–80h also receives a column address through a column address path 75 that includes a redundant column circuit 71. The redundant column circuit 71 determines if the column address corresponds to a defective address and outputs either the column address or a redundant column address to a column latch/decoder 100. The column latch/decoder supplies I/O gating signals to an I/O gating circuit 102 that interfaces with columns of the memory banks 80a–h through sense amplifiers 104. Data is coupled to or from the memory banks 80a–h through the sense amplifiers 104 and I/O gating circuit 102 to a data path subsystem 108 which includes a read data path 110 and a write data path 112. The read data path 110 includes a bank of DC sense amplifiers 103 and a read latch 120 that amplify and store data from the I/O gating circuit 102. In the memory device 16a shown in FIG. 2, 64 bits of data are stored in the read latch 120. The read latch then provides four 16-bit data words to an output multiplexer 122 that sequentially supplies each of the 16-bit data words to a four stage read FIFO buffer 124. Successive 16-bit data words are clocked through the read FIFO buffer 124 by a clock signal RCLK generated from the internal clock CKINT by a programmable delay circuit 126. The read FIFO buffer 124 sequentially applies the 16-bit words to a driver circuit 128 which, in turn, applies the 16-bit data words to a data bus 130 forming part of the processor bus 14.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144 responsive to the data clock DCLK. Thus, the input registers 142 sequentially store four 16-bit data words and combine them into one 64-bit data word applied to a write FIFO buffer 148.

The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifiers 104.

To test the memory devices 16a–16h, data are written to each of the banks 80a–80h in a selected pattern. The data are then read from the banks 80a–80h and output on the data bus 49. The read data are then compared to the selected pattern. If any of the read data do not match the selected pattern, a defective row or column is identified. The defect can then be repaired by substituting a redundant row or column for the defective row or column. Such testing can be very time intensive, even at relatively high speeds. There is therefore a need for a more rapid approach to testing such memory devices 16a–16h.

During testing of the memory device 16a, data are written to the memory banks 80a–80h in a selected test pattern. Data are then read from the memory banks 80a–80h and compared to the selected test pattern. If data read from a location in the banks 80a–80h does not match the data written to the location, the driver circuit 128 is driven to a tri-state condition. In the tri-state condition, the driver circuit 128 presents a high impedance, floating output to the data bus 130. A test head 111 indicates the tri-state condition to test circuitry 113 that identify the erroneous data. A redundant row or column can then replace the row or column having the defective location.

To test the memory device thoroughly, it is often necessary to read data from every memory cell and to compare the read data to the correct data. In modern memory devices containing millions of cells, such testing can take a very long time, even at very high testing speeds.

SUMMARY OF THE INVENTION

A plurality of memory devices include respective I/O circuits that read a plurality of data from respective memory arrays. Comparing circuits within the memory devices compare the read data to a desired pattern. The comparing circuits output state bits having logic states indicating whether or not any of the read data is incorrect. The state bits from the comparing circuits control respective output drivers coupled to a data bus. The output drivers drive the data bus responsive to the respective state bits and respective selected edges of a data clock. The internal timing of the memory devices is established so that, responsive to a single command, each of the plurality of memory devices drives the data bus at a different edge of the clock. The data from the memory devices is multiplexed to avoid bus contention. A test system monitors the data bus and identified memory devices having defective rows or columns. The defective rows or columns can then be replaced by redundant rows or columns.

In one embodiment, data from the memory array are read by sense amplifiers. The data are compressed by multiplexers in response to selected bits of an address signal to produce 64 bits of data. The 64 bits of data are applied to line drivers formed from DC sense amplifiers or helper flip-flops that output data to a series of output registers.

Data in the output registers are compared by the comparing circuit to a selected set of data. If the data do not match the selected set of data, the state bit disables the output driver. If the data match the selected set of data the state bit enables the output driver. The data from the buffer is then applied to a data bus responsive to an internal data clock.

Each of the memory devices has a programmable latency, that defines the timing of the respective internal data clock. Upon initialization of testing, the latency of each memory device in a group is established with a distinct latency. A test read command is provided to the memory device at a first time and occupies a plurality of clock edges. Responsive to the test read command, each of the output drivers supplies either data or an error indicator at a unique edge of the respective internal data clock. The test outputs from a plurality of memory devices are provided to the test system at sequential edges of the clock in response to a single command. Compressed test data can thus be read at successive clock edges despite the command requiring a plurality of clock edges.

DETAILED DESCRIPTION OF THE INVENTION

Figure 3:
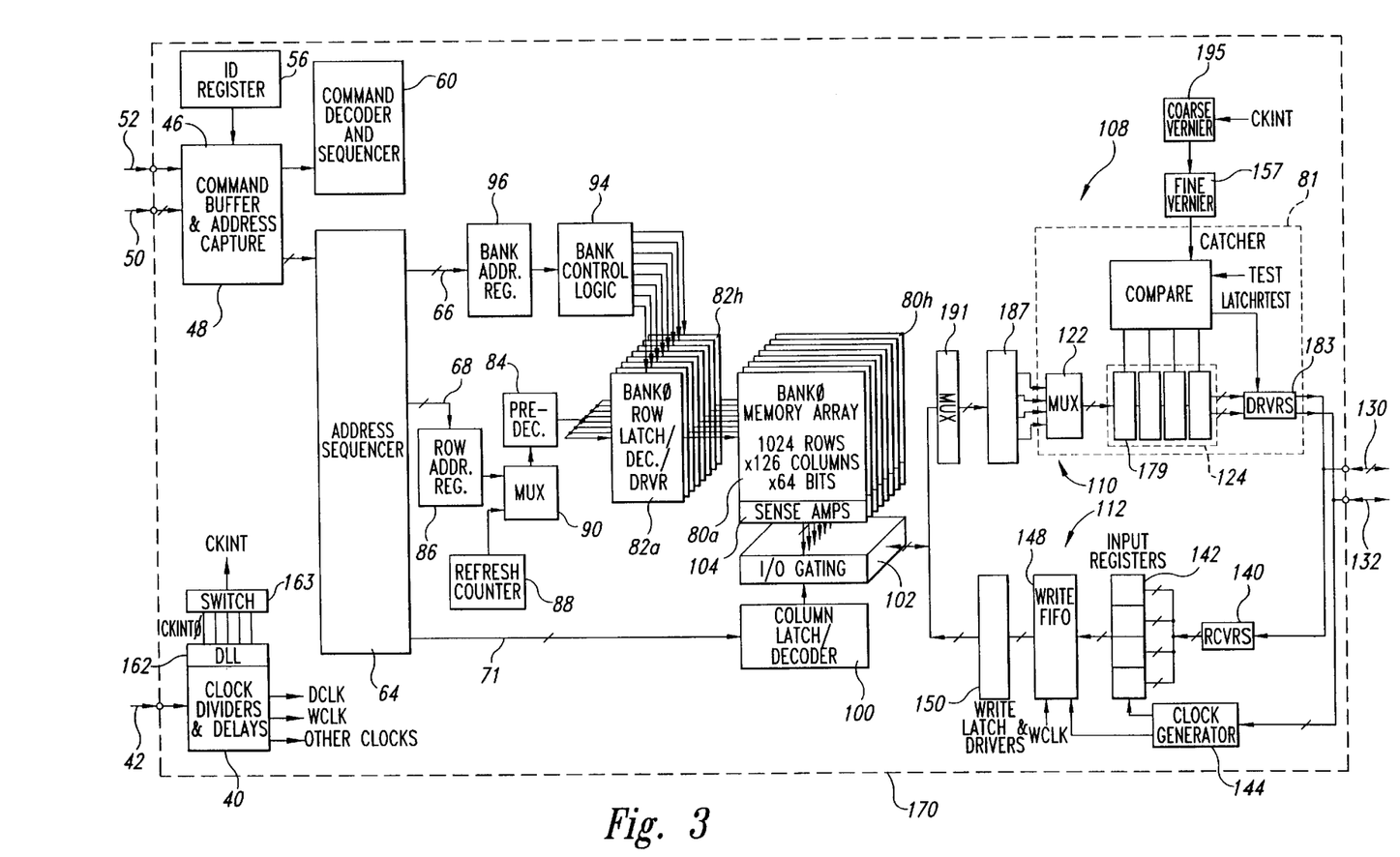
FIG. 3 is a block diagram of a memory device according to the invention including a compare circuit linked to an I/O gating circuit.

FIG. 3 shows a packetized memory device 170 that may be used in the computer system of FIG. 1. The memory device 170 includes several of the same components as the memory device 16 of FIG. 2, such as the memory banks 80a–80h, where common elements are numbered identically. Like the embodiment of FIG. 1, the processor 12 controls the memory device 170 through command packets COM and the external clock signal CKEXT. The memory device 170 also receives data over the 16-bit data bus 130, synchronously with the data clock signal DCLK.

During typical operation, data are written to and read from the memory banks 80a–80h in substantially the same fashion as described above for the memory device 16 of FIG. 2. However, the read data path 110 differs from the read data path 110 of FIG. 2 in the inclusion of 16 comparing circuits 89 that allow a different approach to testing of the memory device 170. During typical operation, the comparing circuits 89 are disabled and do not affect operation of the read FIFO buffer 124 or the driver circuit 128.

Although the read data path 110 is presented as including the read FIFO buffer 124 with four stages of output registers 179, a variety of other data path structures may be utilized in accordance with the invention. For example, the memory device 170 could include input and output data sequencers that employ a plurality of registers to stagger transfers of data DA between the data bus 130 and the I/O gating circuit 102. Control of timing in such data sequencers is described in U.S. patent application Ser. No. 08/833,376, filed Apr. 4, 1997, of Manning which is commonly assigned herewith and which is incorporated herein by reference.

To establish synchronization of the internal and external timing, the clock generator 126 produces several phase-shifted clock signals CKINT-$_{100\ X}$ at respective taps of a delay-locked loop 162 responsive to the external clock signal CKEXT. Each of the phase-shifted clock signals CKINT-$_{\phi X}$ has a respective phase-shift $_{100\ X}$ relative to the external clock signal CKEXT. In response to commands COM, the buffer 46 activates a switching circuit 163 to select one of the phase-shifted clock signals CKINT-$_{100\ 1}$ as a principal internal clock signal CKINT. The selected phase-shifted clock signal CKINT-$_{100\ 1}$ has a phase-shift $_{\phi 1}$ corresponding to delays within the memory device 170 and propagation delays of the external clock signal CKEXT. Because the shifted internal clock signal CKINT-$_{\phi 1}$ is synchronized to the external clock signal CKEXT, operations within the memory device 170 can be synchronized to commands and data arriving at the memory device 170.

Figure 4:
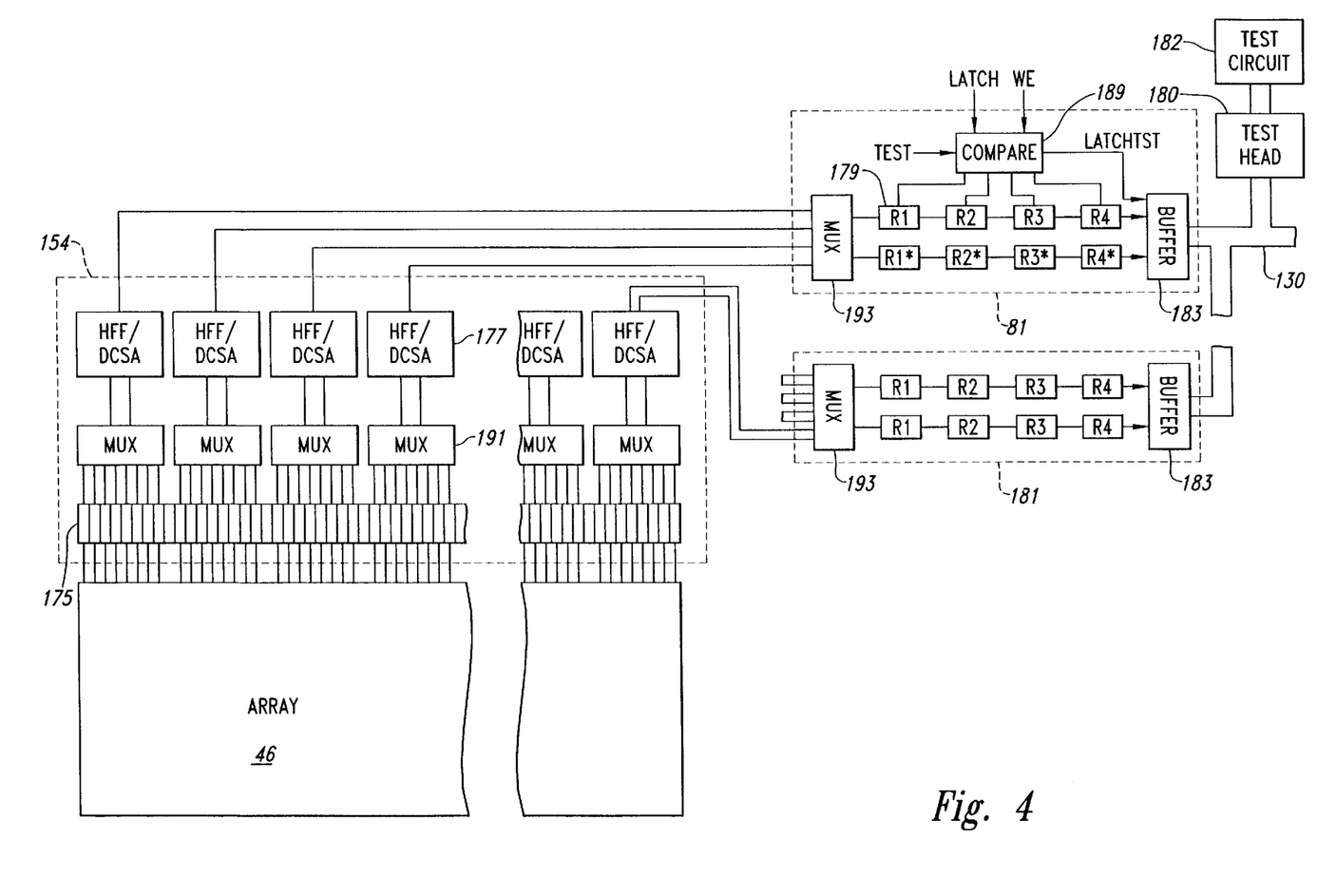
FIG. 4 is a block diagram of an array, I/O gating circuit, comparator, and an output data path in the memory device of FIG. 3.

For reading data from the memory device 170, the I/O gating circuit 154, shown in greater detail in FIG. 4, under control of the command sequencer and decoder 60 prefetches 64 bits of data from one of the memory banks 80a–80h and transfers the prefetched data to an output circuit 181 responsive to the internal clock signal CKINT. The I/O gating circuit 154 includes a set of sense amplifiers 175 for each digit line pair. For example, an array having 512 digit line pairs would include 512 sense amplifiers 175 that read data from the digit lines and provide complementary output data in response. A set of multiplexers 191 receive the data from the sense amplifiers 175 and, responsive to a control signal from the buffer 46, output the 64 bits of data. As shown in FIG. 2 for the example described above of a 512 column array, the multiplexers 191 would be 8-to-1 multiplexers so that each multiplexer 191 would output data from one of 8 digit line pairs.

The output data from each multiplexer 191 in the multiplexer bank are then applied to a line driver 177, which is typically formed from a DC sense amplifier or helper flip-flop. The line driver 177 converts the low drive current signals from the sense amplifiers 175 and multiplexer 191 to corresponding signals with higher current capability. The line drivers 177 output the data to a corresponding output circuit 181 where the data are received by a second bank of multiplexers 193. The second bank of multiplexers 193 multiplexes the 64 bits by a factor of four to provide four sets of 16 bits that are input to a series of four pairs of 16-bit output registers 179. Since there are complementary data signals for each bit, each bit utilizes two registers (a bit register and a complementary bit register). As best seen in FIG. 2, for each complementary line pair, the output circuit 181 includes eight output registers that receive the data responsive to the internal clock signal CKINT. The data in the eight output registers are latched into a tri-state output buffer 183 by a read latch signal LATCHR from an output vernier 157.

The read latch signal LATCHR is a pulsed signal that is produced responsive to a selected edge of the internal clock signal CKINT. The edge is selected by a coarse vernier 195 within the clock generator 126 responsive to a coarse adjust signal ADJ_C from the buffer 46. In response to the read latch signal LATCHR, each tri-state output buffer 183 outputs four bits of output data to respective lines of the 16 line data bus 149. The read latch signal LATCHR has a frequency twice that of the internal clock signal CKINT because the pulses of the read latch signal LATCHR are produced by an output vernier 157 responsive to both rising and falling edges of the internal clock signal CKINT. Thus, four bits of data are transferred from the eight output registers 179 to the data bus 130 over a period about equal to two cycles of the internal clock signal CKINT.

During testing, the read data are evaluated by the comparing circuits 189, before any data are output, as will now be described. For testing the device 170, the comparing circuits 189 are enabled by a test signal TEST from the buffer 46. After the series of four registers 179 are filled and before any of the data are output to the data bus 130, the respective comparing circuit 189 compares the 4 bits of data from its respective series of four registers 179 to a specified bit pattern or to each other to see if any of the data are incorrect. For example, if the specified bit pattern is "1111," the comparing circuit 189 determines that the data are defective if any of the bits is "0." One skilled in the art will recognize that the comparison function of the comparing circuits 189 can be implemented with a variety of circuit structures. For example, where the desired bit pattern is "1111" the comparing circuit 189 may use a 4-input NAND gate to verify that all of the bits are "1s." Where the bits are compared to each other, the comparing circuit 189 may include NAND gates and NOR gates for the comparison.

In addition to monitoring the data in the registers 179, the comparing circuit 189 also monitors command signals from the sequences and decoder 60, such as a write enable signal WE, to determine if reading is disabled. In response to its detection of a non-reading mode or detection of an incorrect data pattern, the comparing circuit 189 outputs a flag signal FLAG to the output driver 183. Because the comparing circuit 189 monitors the data in all four registers 179, a single flag signal FLAG can correspond to four bits of data. Thus, for each set of 4 bits of data, the flag signal FLAG indicates if any one of the 4 bits is erroneous.

The flag signal FLAG from the comparing circuit 189 is applied to an enable input of the respective tri-state output buffer 183. If the flag signal FLAG is true, the tri-state output buffer 183 is disabled and provides an error indication to the data bus 130. The error indication is a tri-state output, i.e., a floating, high impedance.

A test head 180 (FIG. 3) monitors the data bus 130, and responsive to the tri-state output, registers the data as invalid. Additional test circuitry 182 receives the information from the test head 180 and indicates that the corresponding four columns include a defective column. The defective four columns can then be replaced by a set of four redundant columns.

As can be seen from the above description, the memory device 170 outputs a single bit of data or a tri-state condition for every four transitions of the clock CKINT. The four transitions equal the time utilized to receive the four packet words of the command packet COM. The single bit of data or tri-state condition is thus responsive to a single command packet COM and provides information about four memory locations.

Figure 5:
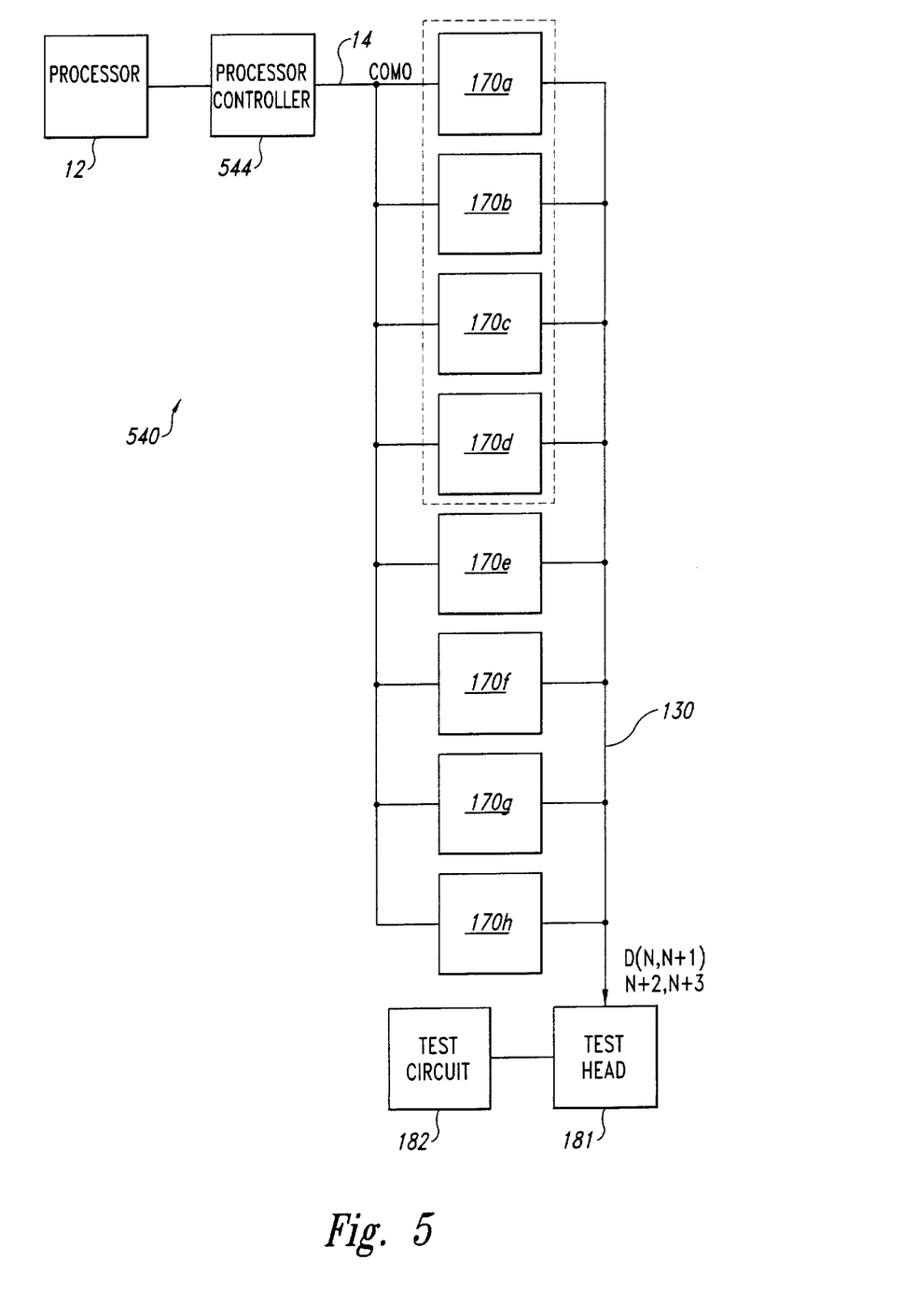
FIG. 5 is a schematic of a test system including eight memory devices according to the invention.

The test system shown in FIG. 5 shows one approach that takes advantage of the compressed test information to improve the overall speed of testing. As shown in FIG. 5, a memory system 540 includes a memory controller 544 that controls eight memory devices 170a–170h according to the packetized protocol described above. Upon initialization of the memory system 540, the memory controller 544 establishes the timing of each of the memory devices 170a–170h by establishing the latencies of the memory devices 170a–170h as will be described below. The memory controller 544 thus ensures that output data from the memory devices 170a–170h will reach the memory controller 544 coincident with specific edges the master clock signal CKEXT.

Referring once again to FIG. 4, if the comparing circuit 189 has determined that the data in the registers 179 is valid, it activates a pulse source to output a test output signal LATCHR-TST. The test output signal LATCHR-TST is a single low-going pulse responsive to a leading edge of the output latch signal LATCHR, which clocks the first bit from each group of 4 output registers 179 to the ti-state output buffer 183 and also enables the output buffer 183. When the data are valid, the tri-state buffer 183 thus outputs a single valid data bit. If the comparing circuit 189 determines that the data are not valid or that writing is disabled, the test latch signal LATCHR-TST remains high so that the tri-state buffer 183 outputs tri-state impedance as described below with reference to FIG. 6. Because the test latch signal LATCHR-TST is responsive to the output signal LATCHR, the test latch signal LATCHR-TST will have the same latency as the output signal LATCHR.

Prior to testing, the memory controller 544 establishes a different timing structure than that for typical reading. To establish the timing for testing, the memory controller 544 first sends command packets COM to each memory device 170a–170h instructing the memory devices 170a–170h to provide selected data on the data bus 130 at respective unique edges of the external clock signal CKEXT by supplying coarse delay data to the devices 170a–170h. Referring now to FIG. 1, the coarse adjust data ADJ_C is a start or stop count that drives a counter circuit within the coarse vernier 195 so that the coarse vernier 195 provides a pulse at a specified number of pulses following the command COM. The pulse from the coarse vernier 195 is then adjusted by a fine vernier 157 to form the test latch signal LATCHR-TST that controls clocking of data through the registers 179. The coarse verniers 195 thus adjust the latencies of the memory devices 170a–170h.

Where the command packet COM includes four command words, the memory controller 544 groups the devices 170a–170d, 170e–170h are grouped into groups of four. Then, each device 170 in the group receives a respective command that establishes the latencies of the devices 170 so that the devices 170 output their data at successive clock edges responsive to a single command packet COM. For example, if the uppermost device 170a in the first group outputs data at an Nth clock edge following a command, the next device 170b will output data at the (N+1)th clock edge following a command.

Once the testing timing is established, each device 170a–170d, 170e–170h in a group receives a read command including a read address with default identification data that are accepted as valid by all four devices 170a–170d or 170e–170h in the group. In response to the single read command, all four devices transfer data to their respective output registers 179. At the established clock edges, the output buffers 183 output either the valid data from the first register 179 or the tri-state condition. Thus, the four devices 170a–170d in the first group output valid data or error data at clock edges N, N+1, N+2, N+3 following the read command. Since each device 170a–170d has a different latency, each device 170a–170d outputs data at a separate clock edge and the data do not collide on the data bus 130. Also, because each bit of data indicates the status of 4 memory locations, data for 16 memory locations are output on only 4 clock edges responsive to a single command packet COM.

Figure 6:
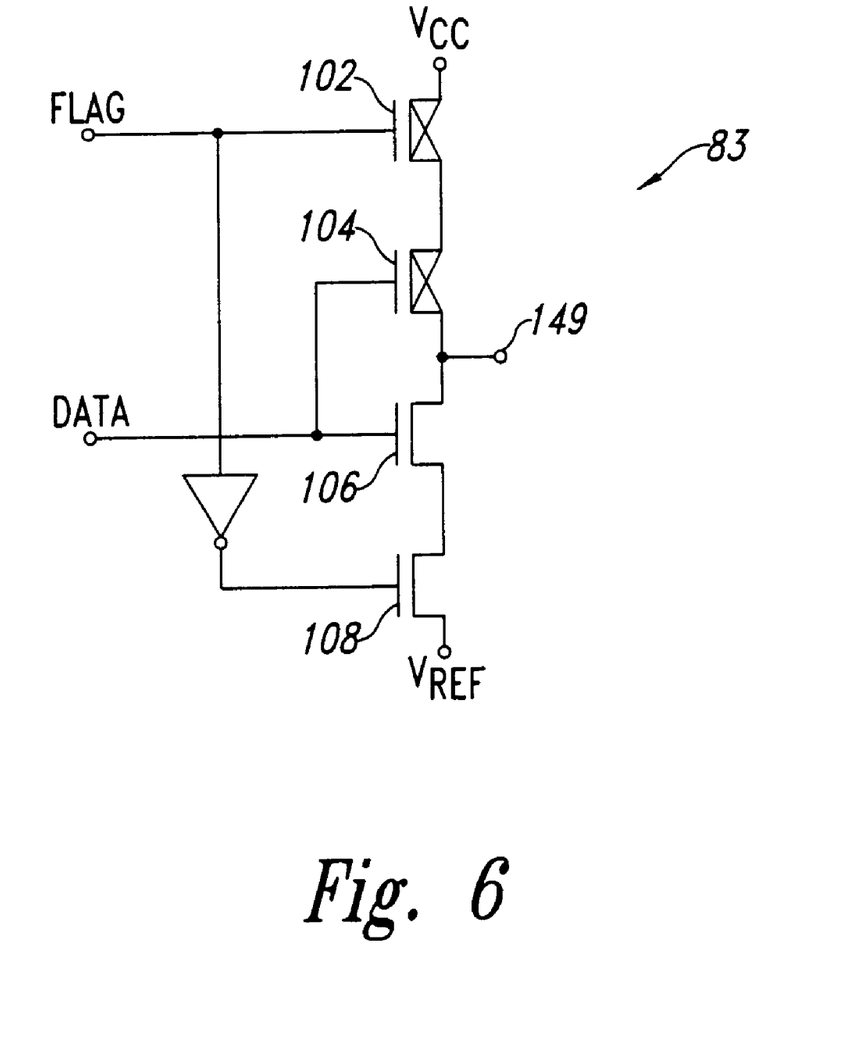
FIG. 6 is a schematic of one embodiment of an output driver for use in the output data path of FIG. 4.

FIG. 6 shows one circuit suitable for use as the tri-state output buffer 183. The tri-state output buffer 183 of FIG. 6 includes 4 transistors 202, 204, 206, 208 serially coupled between the supply voltage $V_{CC}$ and the reference voltage $V_{REF}$. The upper two transistors 202, 204, are PMOS transistors, while the lower two transistors 206, 208 are NMOS transistors. The uppermost and lowermost transistors 200, 202 receive the flag signal FLAG from the compare circuit 189. The middle two transistors 204, 206 are driven by the output of the register 179 and an inverted version of the register output, respectively. One skilled in the art will recognize that if the flag signal FLAG or test latch signal LATCHR-TST is high, the transistors 202, 208 will be OFF and the output of the tri-state buffer 183 will be an open circuit. If the latched flag signal FLAG is low, the transistors 202, 208 will be ON. The output voltage will then be controlled by the data from the registers 179. If one of the registers 179 outputs a high signal, the lower PMOS transistor 204 will be OFF and the upper NMOS transistor 206 will be ON. Consequently, the buffer output will equal the reference voltage $V_{REF}$. If the output from the register 179 is low, the lower PMOS transistor 204 will be ON and the upper NMOS transistor 206 will be OFF. Consequently, the output from the output buffer 183 will be the supply voltage $V_{CC}$.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A method of testing a plurality of memory devices including memory arrays, comprising the steps of:

writing data to each of the memory arrays in a predetermined pattern;

issuing a command to read data from the memory arrays at a first time;

reading data from the arrays responsive to the command;

temporally compressing the read data within the memory devices;

in each memory device, producing output data responsive to the compressed read data; and after the first time, applying the output data from each of the memory devices in a sequence of intervals, wherein the output data from each of the devices occupies a separate interval.

2. The method of claim 1 wherein the step of applying the output data from each of the memory devices in a sequence of intervals includes:

at a second time following the first time, applying the output data from a first memory device to a data bus; and at a third time following the second time, applying the output data from a second memory device to the data bus.

3. The method of claim 1 wherein the step of compressing the read data includes the steps of:

determining whether the read data are correct by comparing a plurality of the read data to a selected pattern;

if the read data match the selected pattern, producing a first compressed data signal; and if the read data do not match the selected pattern, producing a second compressed data signal.

4. The method of claim 1 wherein the step of compressing the read data includes the steps of:

comparing each bit of the read data to other bits of the read data;

producing a first compressed signal if the bits match; and producing a second compressed signal if the bits do not match.

5. The method of claim 3 further including the step of storing the read data in respective registers and wherein the step of determining whether the read data are correct by comparing a plurality of the read data to a selected pattern includes comparing the stored data to the selected pattern.

6. The method of claim 1 wherein the memory device is a synchronous device responsive to a clock signal and wherein the step of applying the output data from each of the memory devices in a sequence of intervals includes applying the output from each device responsive to a respective edge of the clock signal.

7. The method of claim 6 wherein the step of issuing a command to read data from the memory arrays at a first time includes the steps of:

producing a command packet including a plurality of portions; and receiving the portions responsive to respective edges of the clock signal.

8. The method of claim 7 and further comprising determining whether the read data are correct by comparing a plurality of the read data to a selected pattern, and wherein the step of receiving the portions responsive to respective edges of the clock signal includes receiving the portions at a plurality of edges of the clock signal and wherein the number of edges in the plurality of transitions of the clock signal equals the number of data bits in the plurality of read data that are compared to the selected pattern.

9. The method of claim 7 wherein the step of receiving the portions responsive to respective edges of the clock signal includes receiving the portions at a plurality of edges and wherein the number of memory devices equals the number of edges in the plurality of edges.

10. The method of claim 6 wherein each of the memory devices has a respective latency and wherein the step of applying the output from each device responsive to a respective edge of the clock signal include's the step of setting the latency of each of the memory devices to a separate value.

11. A method of transferring data from a memory array within a plurality of memory devices to a data bus, comprising the steps of:

issuing a command to the plurality of memory devices during a first interval;

receiving the command at each of the memory devices;

responsive to the issued command, outputting data from a first of the devices at a first latency relative to the issued command; and responsive to the issued command, outputting data from a second of the devices at a second latency relative to the issued command different from the first latency.

12. The method of claim 11 wherein the devices are synchronous devices responsive to a clock signal and wherein the step of receiving the command at each of the memory devices includes the steps of:

receiving a first portion of the command at a first edge of the clock signal; and receiving a second portion of the command at a second edge of the clock signal.

13. The method of claim 12 wherein the second edge immediately follows the first edge.

14. The method of claim 11 wherein the step of outputting data from a first of the devices at a first latency relative to the issued command includes the steps of:

reading a plurality of previously stored data from the memory array; and compressing the read data.

15. The method of claim 14 wherein the step of outputting data from a first of the devices at a first latency relative to the issued command includes the steps of:

determining, within the first memory device, if any of the read data in the plurality of read data correspond to an error;

if any of the read data in the plurality of read data correspond to an error, producing a flag signal having a first logic state indicating the presence of an error and a second logic state indicating the absence of an error;

transferring the flag signal to an output driver circuit;

if the flag signal has the second logic state, outputting the read data responsive to a clock edge defined by the first latency; and if the flag signal has the first logic state producing an error indicator with the output driver circuit at the clock edge defined by the first latency.

16. The method of claim 15 wherein the step of outputting data from a second of the devices at a second latency relative to the issued command includes the steps of:

reading data from the memory array in the second memory device responsive to the command;

determining, within the second memory device, if any of the read data from the memory array in the second memory device correspond to an error;

if none of the read data from the memory array in the second memory device correspond to an error, outputting the read data responsive to a clock edge defined by the second latency; and if any of the read data from the memory array in the second memory device correspond to an error, outputting the outputting an error indicator responsive to the clock edge defined by the second latency.

17. A method of switching a plurality of memory devices into test mode, comprising the steps of:

selecting a plurality of different latencies;

adjusting a latency of a first of the devices to correspond to a first of the selected latencies; and adjusting a latency of a second of the devices to correspond to a second of the selected latencies different from the first of the selected latencies.

18. The method of claim 17 wherein the memory devices include timing adjust circuits and the step of adjusting the latency of the first of the devices to correspond to the first of the selected latencies includes adjusting the delay of the timing adjust circuit in the first of the memory devices.

19. The method of claim 18 wherein the step of adjusting the delay of the timing adjust circuit in the first of the memory devices includes the step of:

issuing a timing adjust command from a location outside of the first memory device;

receiving the timing adjust command at the first memory device; and adjusting the first timing adjust circuit responsive to the timing adjust command.

20. A method of transferring data from a plurality of memory arrays within respective memory devices to a data bus, comprising the steps of:

selecting a respective latency corresponding to each of the memory devices;

issuing a command to each of memory devices indicating the selected respective latency;

issuing a read command to each of the memory devices;

retrieving data from each of the arrays responsive to the read command;

segmenting the data from each of the arrays into respective groups, each group containing a plurality of bits;

if any of the bits in a selected one of the groups corresponds to an error at the respective memory array, producing an error signal in the respective memory device;

if none of the bits in the selected one of the groups corresponds to an error at the memory array, producing a data signal in the respective memory device; and at each memory device, applying the error signal or the data signal to the data bus at a respective time defined by the selected respective latency.

21. The method of claim 20 further including the step of adjusting the latency of one or more of the devices in response to the issued command indicating the respective selected latencies.

22. The method of claim 21 wherein the step of adjusting the latency of one or more of the devices in response to the issued command indicating the respective selected latencies includes adjusting an output clock circuit s in response to the issued command.

23. A memory device, comprising:

an output driver circuit having a data output terminal adapted for coupling to a data bus and an error input terminal, the output driver circuit being operative to produce a tri-state output signal in response to an error signal at the error input terminal;

a memory array arranged in rows and columns;

an I/O interface coupled between the array and the output driver circuit, the I/O interface being configured to read data from a plurality of memory cells within the memory array; and a comparing circuit having an input coupled to the I/O interface and an error output terminal coupled to the error input terminal, the comparing circuit being responsive to compare a plurality of data from the I/O interface to a selected set of data and to produce the error signal at the error output terminal in response to the data from the I/O interface not matching the selected set of data.

24. The memory device of claim 23, further comprising a multiplexer coupled between the I/O interface and the output driver.

25. The memory device of claim 24, further comprising a plurality of output registers coupled between the multiplexer and the output driver circuit.

26. The memory device of claim 25 wherein the output registers are serially coupled.

27. The memory device of claim 25, further comprising a clock circuit having a first clock output coupled to the output registers, and a second clock output coupled to the I/O interface.

28. The memory device of claim 27, wherein the I/O interface is configured to read a plurality of data from the array in response to a transition of the first clock signal.

29. The memory device of claim 28 wherein the multiplexer is responsive to the first clock signal to convert the plurality of read data into serial data for input to the output registers.

30. The memory device of claim 29, wherein the first and second clock signals have substantially the same frequency and wherein the output driver outputs the data read on the transition of the first clock signal or the tri-state signal for a plurality of transitions of the second clock signal.

31. A test system including:

a data bus;

a memory device including:

an output circuit having data output terminals coupled to the data bus, an error input terminal and data input terminals, the output circuit being operative to produce an error indicator at the data output terminals in response to an error signal at the error input terminal and to output data signals corresponding to data received at the data input terminals;

a memory array arranged in rows and columns;

an I/O interface coupled to the array, the I/O interface being configured to read data from a plurality of memory cells within the memory array, the I/O interface including a plurality of output terminals coupled to the data input terminals; and a comparing circuit having an input coupled to the I/O interface or the output circuit and an error output terminal coupled to the error input terminal, the comparing circuit being responsive to compare data from the I/O interface or the output circuit to a selected set of data or to each other and to produce the error signal at the error output terminal in response to the data from the I/O interface or the output circuit not matching the selected set of data or to the data not matching each other;

a test head coupled to the data bus, the test head being responsive to detect the error indicator; and testing circuitry coupled to the test head.

32. The test system of claim 31 wherein the memory device further comprises a multiplexer coupled between the I/O interface and the output circuit.

33. The test system of claim 31 wherein the output circuit includes:

a plurality of tri-state drivers; and a plurality of data register sets coupled between the data output terminals and respective ones of the tri-state drivers.

34. The test system of claim 33 wherein the data registers are serially coupled.

35. The test system of claim 31 wherein the comparing circuit is configured to compare a plurality of read data to a select pattern of read data to identify the error condition.

36. A computer system, comprising:

a processor having a processor bus;

an input device coupled to the processor through the processor bus and adapted to allow data to be entered into the computer system;

an output device coupled to the processor through the processor bus adapted to allow data to be output from the computer system; and a memory device coupled to the processor through the processor bus, comprising:

at least one array of memory cells adapted to store data;

an I/O interface coupled to the array, the I/O interface being configured to read data from a plurality of the memory cells within the memory array, the I/O interface including a plurality of output terminals; and a comparing circuit having an input coupled to the I/O interface and an error output terminal, the comparing circuit being responsive to compare data from the I/O interface to a selected set of data or to each other and to produce the error signal at the error output terminal in response to the data not matching the selected set of data or to the data from the I/O interface not matching each other.

37. The computer system of claim 36 further comprising an output circuit coupled to the output terminal of the I/O interface, and wherein the memory device further comprises a multiplexer coupled between the I/O interface and the output circuit.

38. The test system of claim 37 wherein the output circuit includes:

a plurality of tri-state drivers; and a plurality of data register sets coupled between the data output terminals and respective ones of the tri-state drivers.

39. The computer system of claim 38 wherein the data registers are serially coupled.

40. The test system of claim 36 wherein the comparing circuit is configured to compare a plurality of read data to a select pattern of read data to produce the error signal.

* * * * *